(12) United States Patent
Kim et al.

(10) Patent No.: US 7,838,067 B2
(45) Date of Patent: *Nov. 23, 2010

(54) METHOD FOR PRODUCING SINGLE-SIDED SPUTTERED MAGNETIC RECORDING DISKS

(75) Inventors: Kwang Kon Kim, San Jose, CA (US); Ramon Clasara, San Jose, CA (US)

(73) Assignee: Seagate Technology LLC, Scotts Valley, CA (US)

( * ) Notice: Subject to any disclaimer, the term of this patent is extended or adjusted under 35 U.S.C. 154(b) by 29 days.

This patent is subject to a terminal disclaimer.

(21) Appl. No.: 11/678,498

(22) Filed: Feb. 23, 2007

(65) Prior Publication Data

US 2007/0202312 A1 Aug. 30, 2007

Related U.S. Application Data

(62) Division of application No. 11/195,912, filed on Aug. 2, 2005, now Pat. No. 7,267,841, which is a division of application No. 10/434,550, filed on May 9, 2003, now Pat. No. 7,083,871.

(60) Provisional application No. 60/379,007, filed on May 9, 2002, provisional application No. 60/378,967, filed on May 9, 2002.

(51) Int. Cl.
*B05D 5/12* (2006.01)
*G11B 5/71* (2006.01)
*B24B 7/19* (2006.01)

(52) U.S. Cl. .................... 427/130; 428/837; 428/831.2; 451/57; 451/63

(58) Field of Classification Search ................. 427/127, 427/130; 428/832.3, 837, 611, 826, 831.2, 428/848, 848.4, 900, 847, 847.8, 830, 848.8, 428/64.9, 432, 828, 831, 1, 65.5; 385/124; 438/927; 360/135, 16, 17; 216/52; 451/57, 451/63, 93; 369/275.4, 272.1; 264/162
See application file for complete search history.

(56) References Cited

U.S. PATENT DOCUMENTS 3,382,647 A 5/1968 Davey et al.
(Continued)

FOREIGN PATENT DOCUMENTS

JP 63122527 5/1988
(Continued)

OTHER PUBLICATIONS

US 5,762,201, 06/1998, Whalen (withdrawn)

*Primary Examiner*—Kevin M. Bernatz
*Assistant Examiner*—Louis Falasco

(57) ABSTRACT

An information-storage media is provided that includes:
(a) a substrate disk 312 having first and second opposing surfaces;
(b) a first selected layer 304 on the first surface, the first selected layer having a first thickness;
(c) a second selected layer 308 on the second surface, the second selected layer having a second thickness, wherein the first and second selected layers have a different chemical composition than the substrate disk; and
(d) an information-storage layer 412 adjacent to one or both of the selected layers.

The first and second thicknesses are different to provide an unequal stress distribution across the cross-section of the media.

13 Claims, 15 Drawing Sheets

U.S. PATENT DOCUMENTS

| | | | |
|---|---|---|---|
| 3,505,777 | A | 4/1970 | Tsutsumi |
| 4,573,851 | A | 3/1986 | Butler |
| 4,645,702 | A * | 2/1987 | Asakura et al. .......... 428/847.8 |
| 4,669,612 | A | 6/1987 | Mortensen |
| 4,676,008 | A | 6/1987 | Armstrong |
| 4,694,778 | A | 9/1987 | Learn et al. |
| 4,695,217 | A | 9/1987 | Lau |
| 4,724,963 | A | 2/1988 | Mortensen |
| 4,768,328 | A | 9/1988 | Mims |
| 4,808,456 | A | 2/1989 | Yamada et al. |
| 4,819,579 | A | 4/1989 | Jenkins |
| 4,840,530 | A | 6/1989 | Nguyen |
| 4,856,957 | A | 8/1989 | Lau et al. |
| 4,939,891 | A | 7/1990 | Podini |
| 4,947,624 | A | 8/1990 | Cones, Sr. et al. |
| 4,947,784 | A | 8/1990 | Nishi |
| 4,949,848 | A | 8/1990 | Kos |
| 4,958,982 | A | 9/1990 | Champet et al. |
| 4,962,879 | A | 10/1990 | Goesele et al. |
| 4,981,222 | A | 1/1991 | Lee |
| 4,987,407 | A | 1/1991 | Lee |
| 5,007,788 | A | 4/1991 | Asano et al. |
| 5,062,688 | A * | 11/1991 | Okuda et al. ................ 385/124 |
| 5,111,936 | A | 5/1992 | Kos |
| 5,125,784 | A | 6/1992 | Asano |
| 5,188,499 | A | 2/1993 | Tarng et al. |
| 5,250,339 | A | 10/1993 | Tani et al. |
| 5,269,643 | A | 12/1993 | Kodama et al. |
| 5,314,107 | A | 5/1994 | D'Aragona et al. |
| 5,348,151 | A | 9/1994 | Dressen |
| 5,351,156 | A | 9/1994 | Gregory et al. |
| 5,430,992 | A | 7/1995 | Olson |
| 5,476,176 | A | 12/1995 | Gregerson et al. |
| 5,478,622 | A | 12/1995 | Nakamura et al. |
| 5,480,695 | A | 1/1996 | Tenhover et al. |
| 5,486,134 | A | 1/1996 | Jones et al. |
| 5,497,085 | A | 3/1996 | Tian et al. |
| 5,501,568 | A | 3/1996 | Ono |
| 5,612,830 | A | 3/1997 | Gregory et al. |
| 5,620,295 | A | 4/1997 | Nishi |
| 5,664,407 | A | 9/1997 | Cooper, III et al. |
| 5,665,478 | A | 9/1997 | Suzuki et al. |
| 5,773,124 | A | 6/1998 | Ishikawa et al. |
| 5,780,127 | A | 7/1998 | Mikkelsen |
| 5,820,449 | A | 10/1998 | Clover |
| 5,891,586 | A * | 4/1999 | Hasegawa et al. ........... 428/611 |
| 5,906,469 | A | 5/1999 | Oka et al. |
| 5,926,352 | A | 7/1999 | Murayama et al. |
| 5,928,759 | A | 7/1999 | Arita et al. |
| 5,956,317 | A | 9/1999 | Komiyama et al. |
| 5,976,255 | A | 11/1999 | Takaki et al. |
| 5,991,104 | A | 11/1999 | Bonyhard |
| 6,007,896 | A | 12/1999 | Bhushan |
| 6,033,486 | A | 3/2000 | Andros |
| 6,033,522 | A | 3/2000 | Iwata et al. |
| 6,057,021 | A * | 5/2000 | Ishikawa et al. ............ 428/830 |
| 6,086,961 | A | 7/2000 | Bonyhard |
| 6,107,599 | A | 8/2000 | Baumgart et al. |
| 6,117,570 | A | 9/2000 | Chen et al. |
| 6,120,890 | A | 9/2000 | Chen et al. |
| 6,150,015 | A | 11/2000 | Bertero et al. |
| 6,182,814 | B1 | 2/2001 | Koehler |
| 6,228,461 | B1 * | 5/2001 | Sueki et al. ................ 428/847 |
| 6,230,891 | B1 | 5/2001 | Usui et al. |
| 6,345,947 | B1 | 2/2002 | Egashira |
| 6,354,794 | B2 | 3/2002 | Sato et al. |
| 6,368,040 | B1 | 4/2002 | Yamasaki et al. |
| 6,427,850 | B2 | 8/2002 | Mendiola |
| 6,457,929 | B2 | 10/2002 | Sato et al. |
| 6,498,086 | B1 | 12/2002 | Zheng |
| 6,582,279 | B1 | 6/2003 | Fox et al. |
| 6,595,028 | B1 | 7/2003 | Miyamoto et al. |
| 6,596,083 | B2 | 7/2003 | Cromwell et al. |
| 6,612,801 | B1 | 9/2003 | Koguchi |
| 6,625,835 | B1 | 9/2003 | Frost et al. |
| 6,626,744 | B1 | 9/2003 | White et al. |
| 6,664,503 | B1 | 12/2003 | Hsieh et al. |
| 6,706,427 | B2 | 3/2004 | Yokoyama et al. |
| 6,769,855 | B2 | 8/2004 | Yokomori et al. |
| 6,818,331 | B2 | 11/2004 | Sakawaki et al. |
| 6,821,653 | B2 | 11/2004 | Fukushima et al. |
| 6,926,977 | B2 | 8/2005 | Osawa et al. |
| 6,942,933 | B2 | 9/2005 | Osawa |
| 6,954,317 | B2 | 10/2005 | Aoki et al. |
| 7,006,328 | B2 | 2/2006 | Osawa |
| 7,027,246 | B2 | 4/2006 | Valeri |
| 7,052,739 | B2 | 5/2006 | Buitron et al. |
| 7,083,376 | B2 | 8/2006 | Crofton et al. |
| 7,083,502 | B2 | 8/2006 | Buitron et al. |
| 7,083,871 | B2 | 8/2006 | Kim et al. |
| 7,138,194 | B2 | 11/2006 | Shimizu et al. |
| 7,165,308 | B2 | 1/2007 | Grow et al. |
| 7,168,153 | B2 | 1/2007 | Buitron et al. |
| 7,180,709 | B2 | 2/2007 | Kim et al. |
| 2001/0049031 | A1 | 12/2001 | Bajorek et al. |
| 2002/0054976 | A1 | 5/2002 | Nakamura et al. |
| 2002/0142707 | A1 | 10/2002 | Shimada et al. |
| 2002/0159174 | A1 * | 10/2002 | Hashi et al. ................... 360/17 |
| 2003/0179692 | A1 | 9/2003 | Ohotomo |
| 2003/0194464 | A1 | 10/2003 | Iida et al. |
| 2003/0209421 | A1 | 11/2003 | Buitron et al. |
| 2003/0211275 | A1 | 11/2003 | Buitron et al. |
| 2004/0016214 | A1 | 1/2004 | Buitron |
| 2004/0035737 | A1 | 2/2004 | Buitron et al. |
| 2004/0069662 | A1 | 4/2004 | Buitron et al. |
| 2004/0070859 | A1 | 4/2004 | Crofton et al. |
| 2004/0072029 | A1 | 4/2004 | Lowery et al. |
| 2004/0170870 | A1 | 9/2004 | Yokoyama et al. |
| 2005/0003106 | A1 | 1/2005 | Isozaki |
| 2005/0037140 | A1 | 2/2005 | Sakawaki et al. |
| 2005/0121839 | A1 | 6/2005 | Fukushima et al. |
| 2005/0132958 | A1 | 6/2005 | Leng et al. |
| 2005/0266216 | A1 | 12/2005 | Kim et al. |

FOREIGN PATENT DOCUMENTS

| | | |
|---|---|---|
| JP | 4067333 | 3/1992 |
| JP | 5028533 | 2/1993 |
| JP | 6076384 | 3/1994 |
| JP | 7296418 | 11/1995 |
| JP | 8249802 | 9/1996 |
| JP | 10228674 | 8/1998 |
| JP | 11265506 | 9/1999 |

* cited by examiner

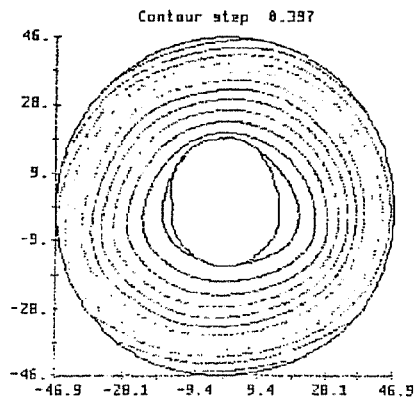 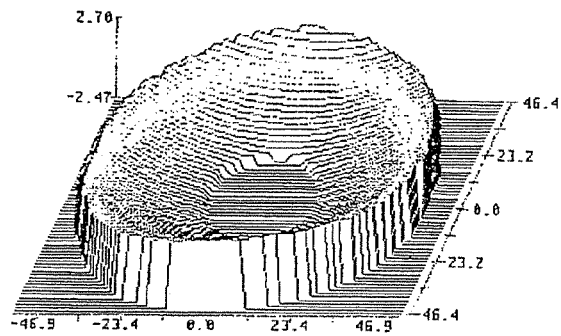
*Fig. 11A*  *Fig. 11B*
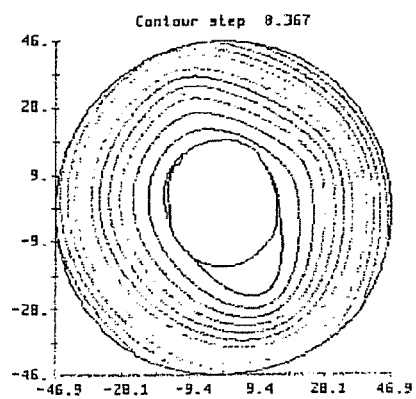 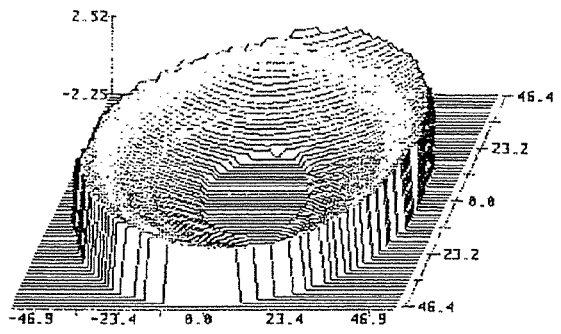
*Fig. 12A*  *Fig. 12B*

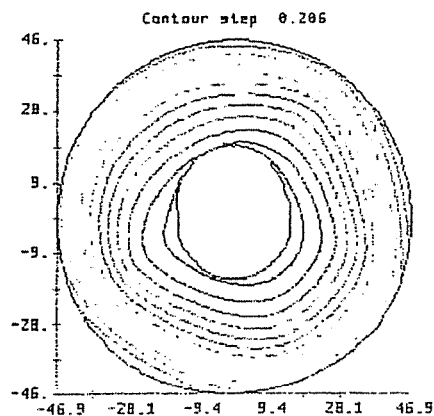 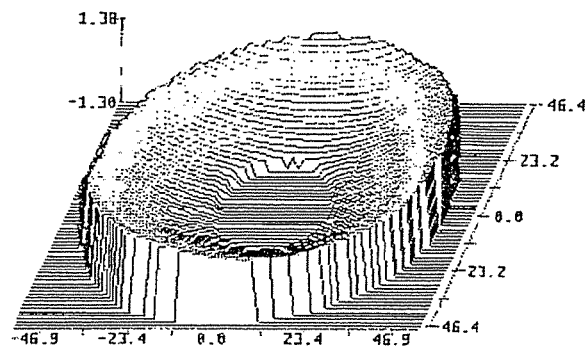
*Fig. 13A*  *Fig. 13B*
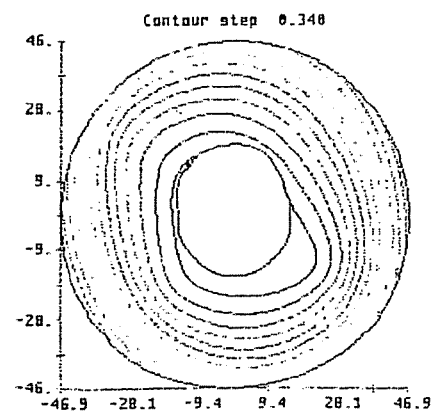 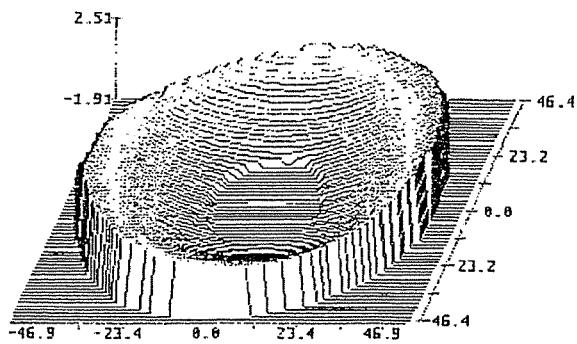
*Fig. 14A*  *Fig. 14B*

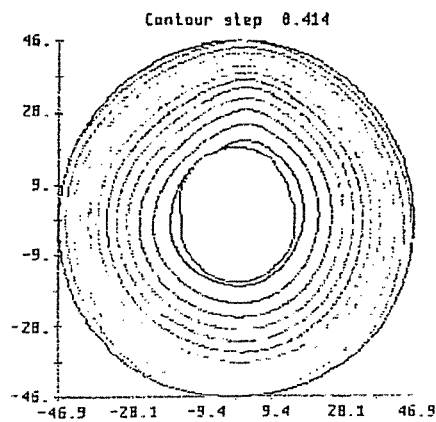
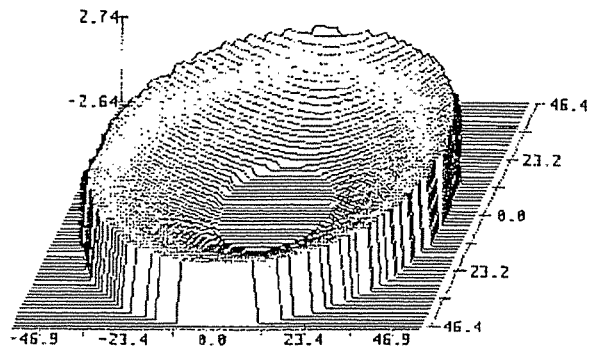
Fig. 15A  Fig. 15B
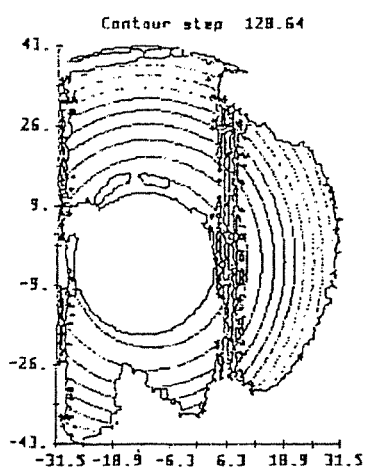
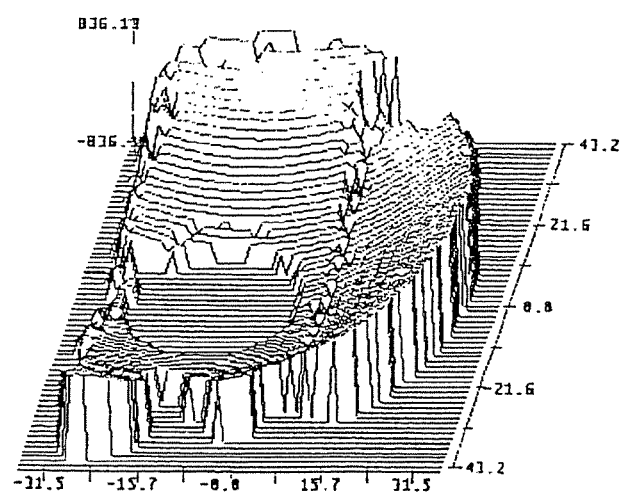
Fig. 16A  Fig. 16B

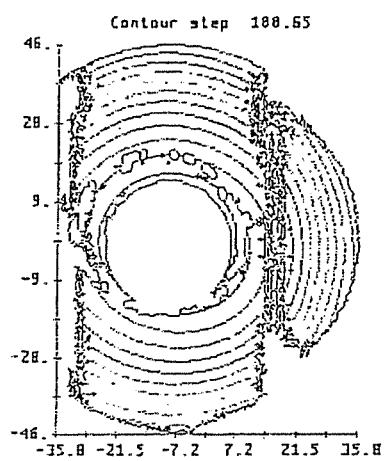 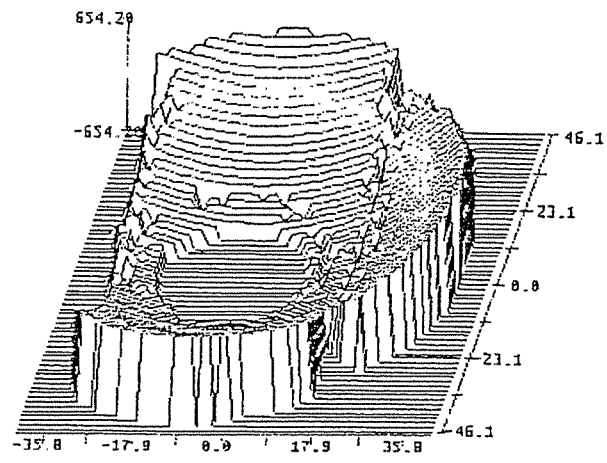
*Fig. 17A*      *Fig. 17B*
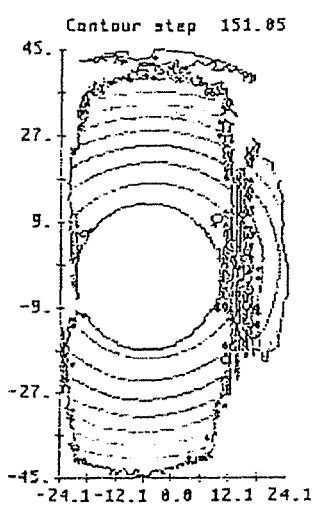 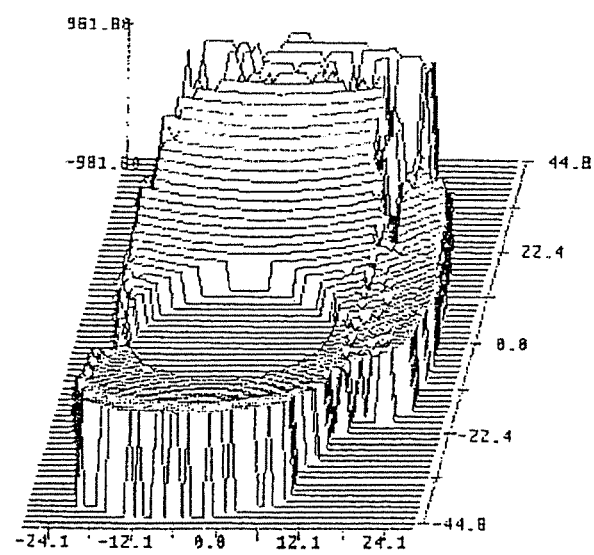
*Fig. 18A*      *Fig. 18B*

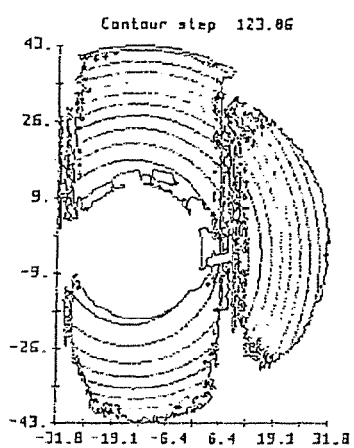 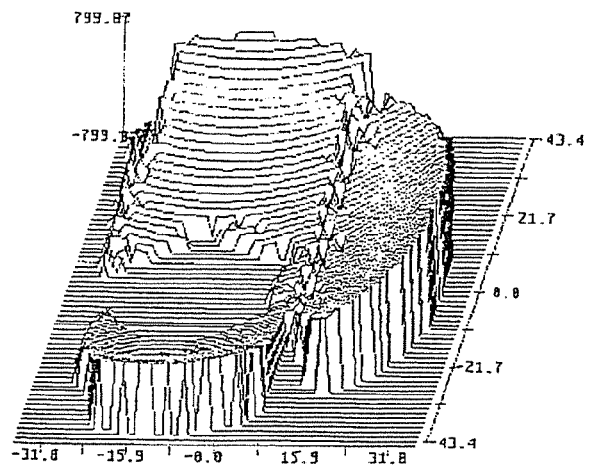
*Fig. 19A*     *Fig. 19B*
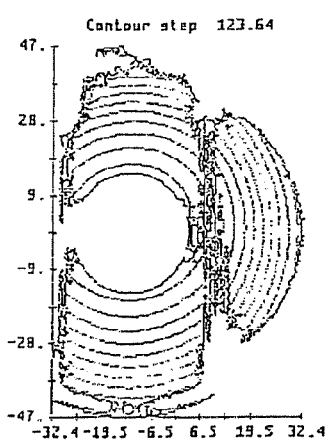 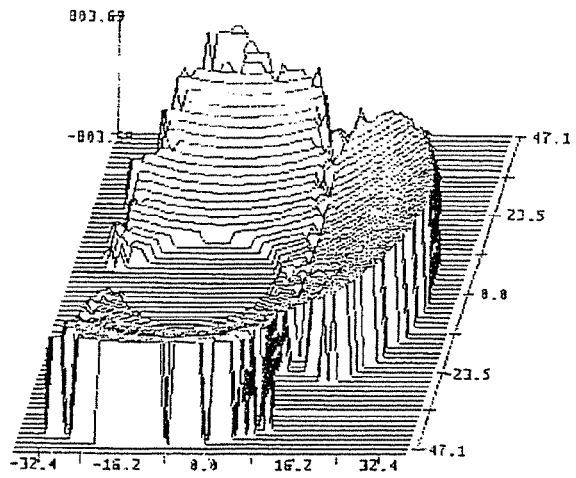
*Fig. 20A*     *Fig. 20B*

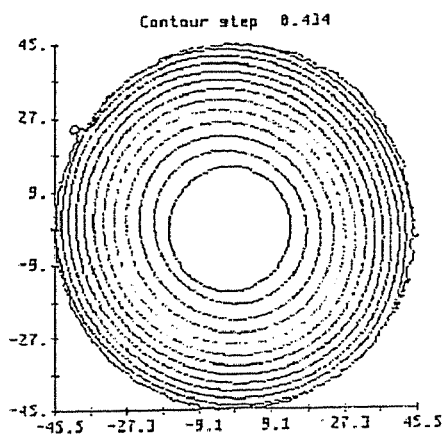
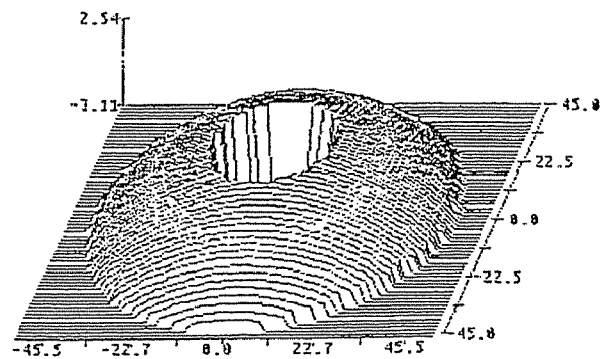
Fig. 21A  Fig. 21B
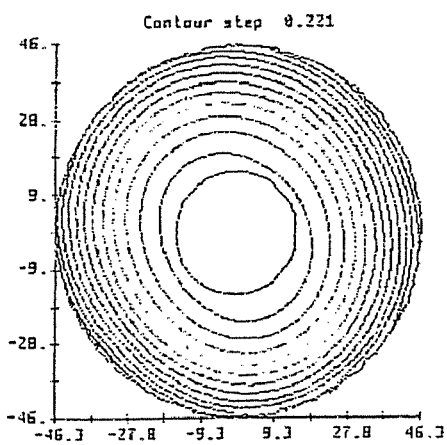
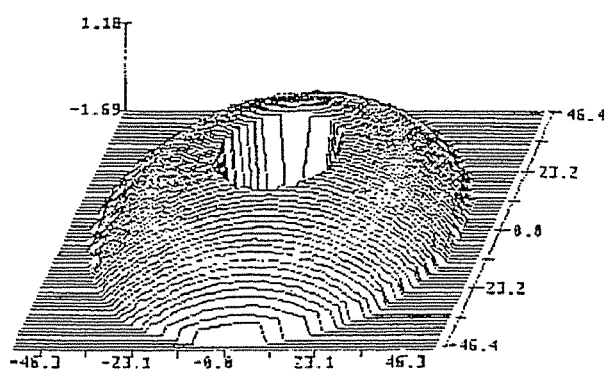
Fig. 22A  Fig. 22B

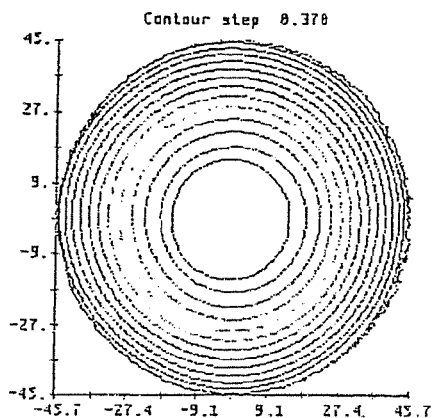 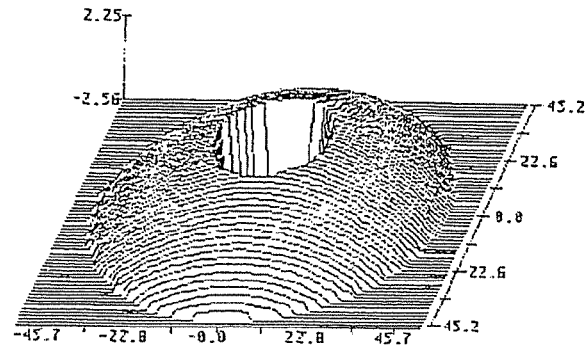
Fig. 23A          Fig. 23B
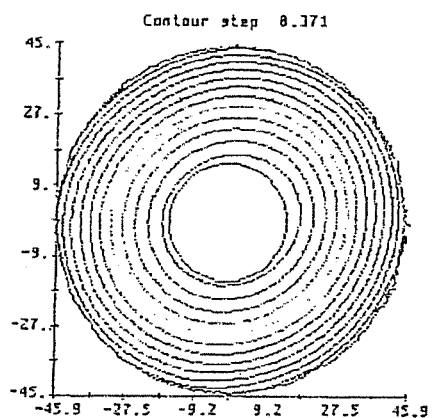 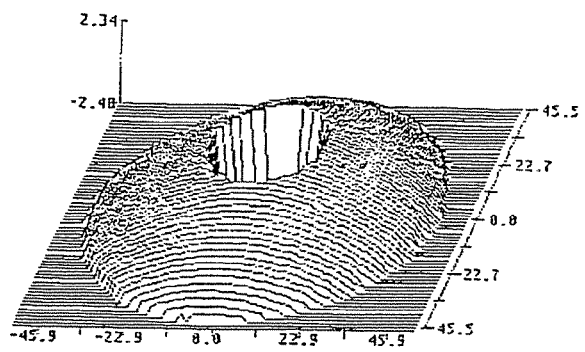
Fig. 24A          Fig. 24B

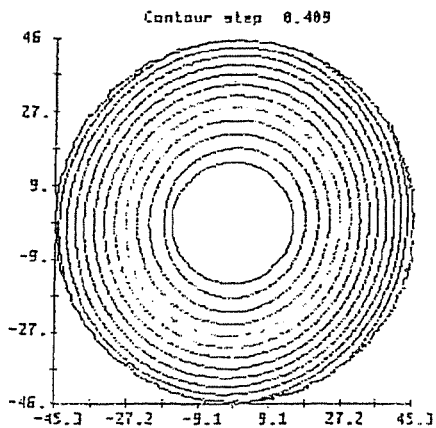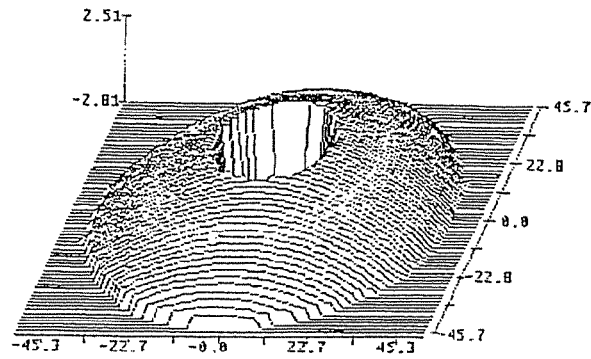
*Fig. 25A*  *Fig. 25B*
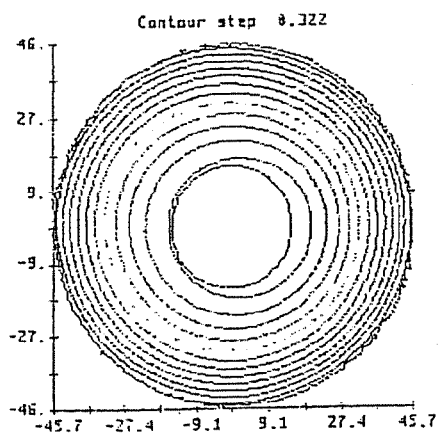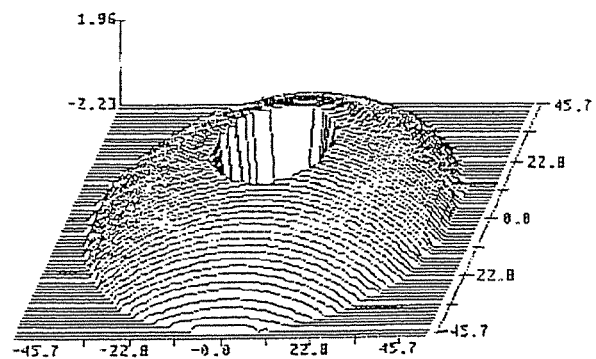
*Fig. 26A*  *Fig. 26B*

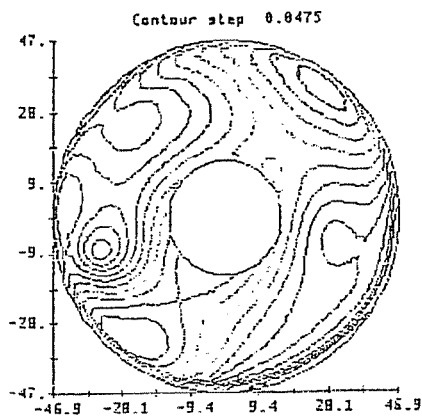 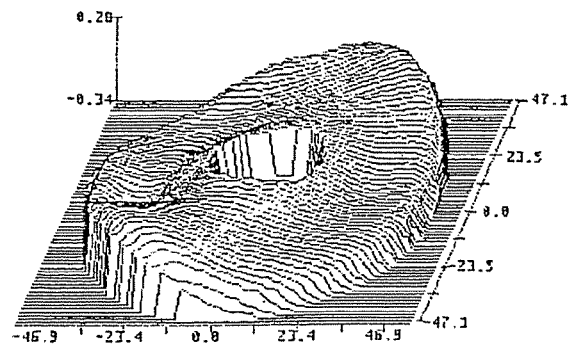
Fig. 27A          Fig. 27B
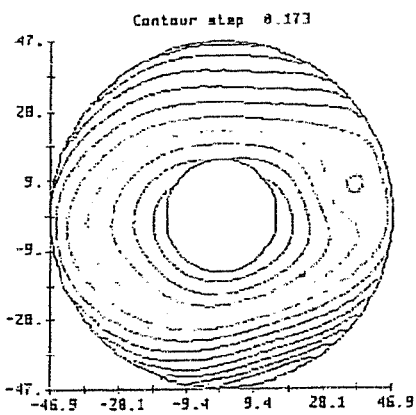 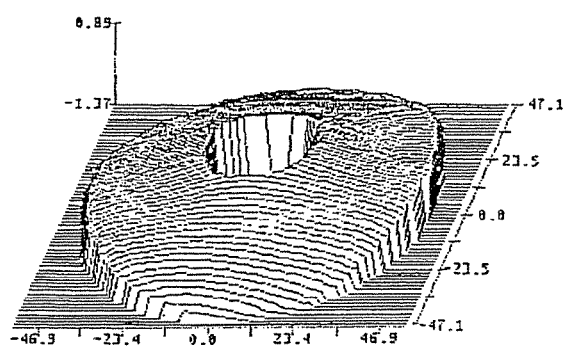
Fig. 28A          Fig. 28B

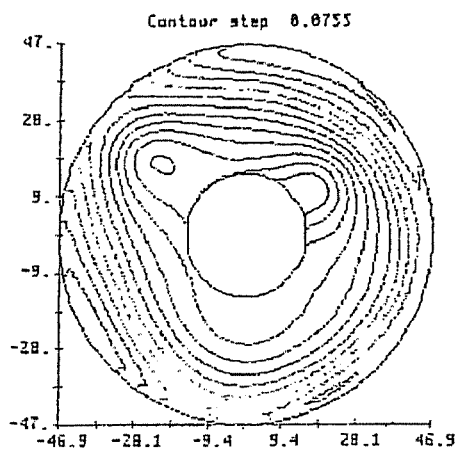 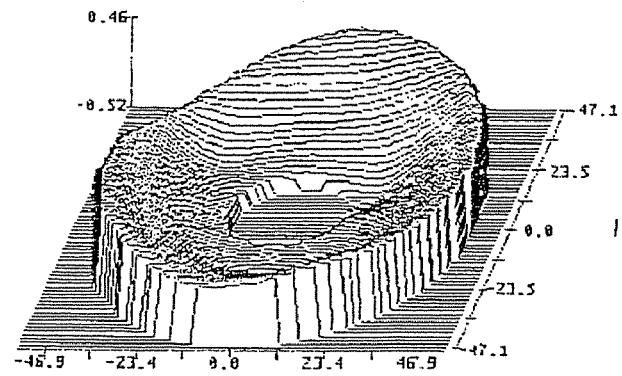
Fig. 29A    Fig. 29B
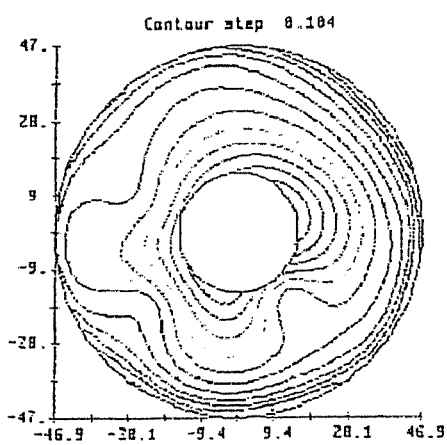 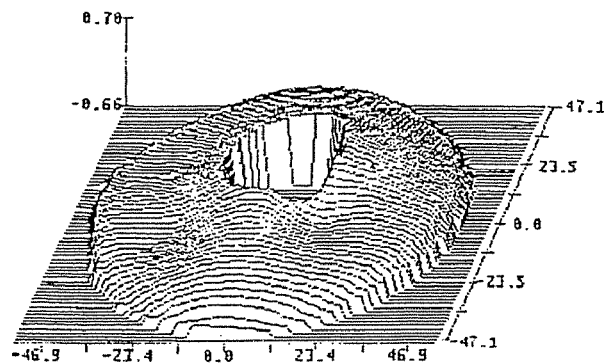
Fig. 30A    Fig. 30B

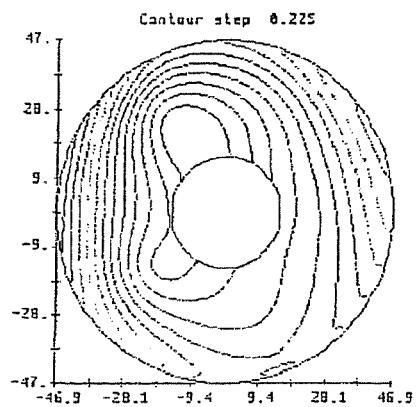 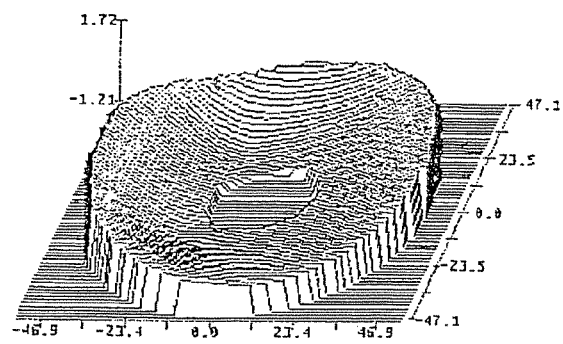
Fig. 31A   Fig. 31B
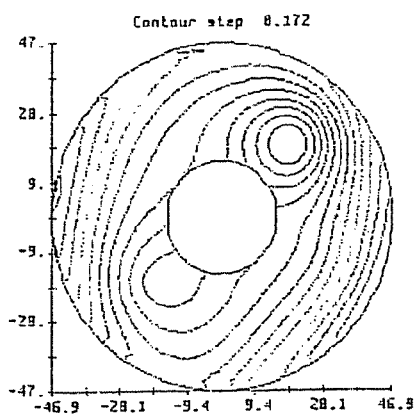 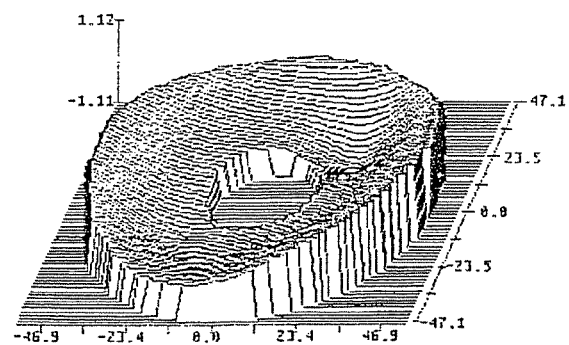
Fig. 32A   Fig. 32B

METHOD FOR PRODUCING SINGLE-SIDED SPUTTERED MAGNETIC RECORDING DISKS

CROSS REFERENCE TO RELATED APPLICATIONS

The present application is a divisional under 35 U.S.C. §120 of U.S. patent application Ser. No. 11/195,912, filed Aug. 2, 2005, now U.S. Pat. No. 7,267,841 which is a divisional under 35 U.S.C. 120 of U.S. patent application Ser. No. 10/434,550, filed May 9, 2003, now U.S. Pat. No. 7,083,871 which claims the benefits of U.S. Provisional Application Ser. Nos. 60/379,007 to Kim et al., and 60/378,967 to Kim, both of which were filed on May 9, 2002, each of the foregoing applications are incorporated herein by this reference.

The subject matter of the present application is related to the following applications, each of which has a filing date of May 9, 2003: entitled Dual Disk Transport Mechanism Processing Two Disks Tilted Toward Each Other to Grow et al.; entitled Information-Storage Media With Dissimilar Outer Diameter and/or Inner Diameter Chamfer Designs On Two Sides to Clasara et al.; entitled Method of Merging Two Disks Concentrically Without Gap Between Disks to Buitron; entitled Apparatus for Combining or Separating Disk Pairs Simultaneously to Buitron et al.; entitled Method of Simultaneous Two-Disk Processing of Single-Sided Magnetic Recording Disks to Buitron et al.; entitled W-Patterned Tools for Transporting/Handling Pairs of Disks to Buitron et al.; entitled Method for Servo Pattern Application on Single-Side Processed Disks in a Merged State to Valeri; entitled Method for Simultaneous Two-Disk Texturing to Buitron et al.; entitled Cassette for Holding Disks of Multiple Form Factors to Buitron et al.; entitled Automated Merge Nest for Pairs of Magnetic Storage Disks to Crofton et al.; entitled Apparatus for Simultaneous Two-Disk Scrubbing and Washing to Crofton et al.; entitled Cassette Apparatus for Holding 25 Pairs of Disks for Manufacturing Process to Buitron et al.; and entitled Method of Lubricating Multiple Magnetic Storage Disks in Close Proximity to Buitron et al. Each of these applications is incorporated by reference in its entirety as if stated herein.

FIELD OF THE INVENTION

The present invention is related generally to recording media and specifically to single-sided magnetic recording media.

BACKGROUND OF THE INVENTION

Hard disk drives are an efficient and cost effective solution for data storage. Depending upon the requirements of the particular application, a disk drive may include anywhere from one to twelve hard disks and data may be stored on one or both surfaces of each disk. While hard disk drives are traditionally thought of as a component of a personal computer or as a network server, usage has expanded to include other storage applications such as set top boxes for recording and time shifting of television programs, personal digital assistants, cameras, music players and other consumer electronic devices, each having differing information-storage capacity requirements.

As aerial bit densities of hard disks have dramatically increased in recent years, the large data storage capacities of dual-sided magnetic storage media far exceed demand in many applications. For example, dual-sided hard disks in personal computers have much greater storage capacity than most consumers require during the useful life of the computer. Consumers thus are forced to pay substantial amounts for excess data storage capacity. The intense price competition in the magnetic storage media industry has forced many disk drive manufacturers to offer single-sided magnetic storage media as an alternative. Single-sided storage media are of two types. In one type, a double-sided disk configured to store information on both sides of the disk is installed with a single read/write head serving only one side of the disk. In the other type, known as a single-sided processed disk, only one side of the disk is provided with an information-containing magnetic layer. The other side of the disk does not have an information-containing layer. Single-sided processed disks not only have sufficient storage capacities to satisfy most consumers but also can be manufactured at lower costs than dual-sided disks due to reduced material usage. Nonetheless, there is an ongoing need for less expensive storage media.

SUMMARY OF THE INVENTION

A single-sided processed disk has been developed to provide a low cost storage media. A recurring problem with the single-sided processed disks is the degree of planarity or flatness of the disk. Referring to FIGS. 1 and 2, a single-sided processed magnetic recording disk 100 is illustrated. The disk 100 includes a substrate disk 200 (which is typically aluminum or an aluminum alloy), upper and lower selected layers 204 and 208 (which are typically nickel phosphorus), an underlayer 212 (which is typically chromium or a chromium alloy), a magnetic layer 216 (which typically is a cobalt-platinum-based quaternary alloy having the formula CoPtXY or a five element alloy CoPtXYZ, where XY and Z can be tantalum, chromium, nickel or boron), an overcoat layer 220 (which is typically carbon), and a lubricant layer 224 (which is typically a perfluoropolyether organic polymer). The nickel phosphorus layers have the same thicknesses, "$t_u$" (upper layer thickness) and "$t_L$ (lower layer thickness), (each of which is typically from about 8 to about 15 micrometers) and are typically deposited by electroless plating techniques. The underlayer, magnetic layer, and overcoat layer have different thicknesses (their total thickness is typically from about 20 to about 100 nm) and are deposited by sputtering techniques. Although nickel phosphorus layers can be deposited in either compression or tension, they are typically deposited in compression and the sputtered layers are also typically deposited in compression. As can be seen from FIG. 2, the compressive forces in the lower nickel phosphorus layer 208 are more than offset by the compressive forces in the upper nickel phosphorus layer 204 and the sputtered layers 212, 216 and 220, causing the disk 100 to be concave on the upper side 228 of the disk and convex on the lower side 232.

The disk concavity on the infonnation storing side of the disk can cause problems. Disk concavity can cause problems in read/write operations, such as due to head tracking errors and undesired contact of the head with the disk surface. Because of these issues, typical disk specifications require a flatness on the information-containing or active surface of the disk of no more than about 7 to about 15 microns. As will be appreciated, "flatness" refers to the distance between the highest and lowest points on a disk surface. With reference to FIG. 2, the flatness is the difference in the elevations of points 1 and 2, where point 1 is the lowest point on upper disk surface 228 while point 2 is the highest point on the upper disk surface 228.

These and other needs are addressed by the various embodiments and configurations of the present invention.

The present invention is directed generally to controlling the stresses (either compressive and/or tensile) in the layers/films deposited on either side of information-storage media to produce a desired degree of flatness or shape in the media.

In one aspect of the present invention, an information-storage media is provided that includes:

(a) a substrate disk having first and second opposing surfaces;

(b) a first selected layer on the first surface;

(c) a second selected layer on the second surface; and (d) an information-storage layer adjacent to one or both of the selected layers. The first selected layer has a first thickness, and the second layer a second thickness. The first and second selected layers have a different chemical composition than the substrate disk, which typically cause the selected layers to have a differing magnitude of internal compressive or tensile stress than is present in the substrate disk. In other words, the stress distribution across the thickness of the media is non-uniform. To provide a desired disk shape, the first and second thicknesses are different, causing a desired balance or imbalance between compressive/tensile stresses on either side of the substrate disk. As shown in the figures and discussed below, it is to be understood that the "selected layer" may or may not be positioned between other layers. In one configuration, the selected layer is configured as a backing layer on a reverse side of the disk.

In one media configuration, the first thickness is no more than about 99.3% of the second thickness, and the difference in thickness between the first and second selected layers is at least about 0.075 microns. Although the selected layer adjacent to the information-storage layer is normally thinner than the nonadjacent selected layer, it may be desirable to have the thicker selected layer adjacent to the information-storage layer.

Preferably, the first and second selected layers comprise nickel phosphorus. Although the first and second selected layers typically have the same chemical composition, there may be applications where differing materials are used in the two layers.

The information-storage layer can store information by any suitable technique, such as by optical, magneto-optical, or magnetic techniques. The material in the layer can be a thin film, a thick film, or a bulk material. Preferably, the information-storage layer is a thin film ferromagnetic material.

The media can include other layers. For example, an underlayer may be positioned between the information-storage layer and the first selected layer, and an overcoat layer above the information-storage layer. The materials in the layers can be thin films, thick films, or bulk materials. In one media configuration, the information-storage layer, underlayer, and overcoat layer are each thin films and in compression. In other media configurations, one or more of the layers can be in tension.

In one media configuration, the first selected layer is positioned between the information-storage layer and the substrate disk while the second surface is free of an information-storage layer. So configured, the disk has one active side and one inactive side. The medium can be single- or dual-sided. In other words, one or both surfaces of the medium can be "active". As used herein, "active" or "information-containing" means that the disk surface is configured to store data. As used herein, "inactive", "non-active," or "noninformation-containing" means that the medium surface is not configured to store data. For example, the active side of the medium has an information storage layer(s), such as a magnetic layer, while the inactive side of the medium has no information storage layer(s).

In another aspect, a method for manufacturing a single-sided information-storage media is provided that includes the steps of:

(a) providing first and second intermediate structures, each of the first and second intermediate structures comprising substrate disks and upper and lower selected layers on opposing upper and lower sides, respectively, of each substrate disk;

(b) placing the lower selected layer of the first intermediate structure adjacent to the lower selected layer of the second intermediate structure, such that the first and second intermediate structures are in a stacked relationship; and (c) simultaneously removing at least a portion of each of the upper selected layers of the first and second intermediate structures while in the stacked relationship to provide, for each of the first and second intermediate structures, upper and lower selected layers having different thicknesses.

The present invention can have a number of advantages compared to conventional storage media configurations and fabrication processes. For example, disk concavity on the information storage side of a disk can be controlled, thereby avoiding problems in read/write operations, such as due to head tracking errors and undesired contact of the head with the disk surface. In particular, single-sided media can have reduced flatness values by eliminating the systematic stress imbalance across the disk cross-section. The final storage media can be consistently and repeatedly provided with a flatness in compliance with ever decreasing disk specifications, which currently require a maximum flatness on the information-containing surface of the disk in the range of about 7 to about 15 microns. The ability to control the flatnesses of the intermediate and final media permit manufacturers to produce media with desired shapes, e.g., flatnesses, for a wide variety of applications. For example, single-sided and dual-sided disks can both be provided with a desired degree of concavity or convexity. To provide a more curved shape, a stress imbalance can be introduced between the two sides of the media. The ability to remove simultaneously from two stacked media differing thicknesses of selected layer can provide substantial cost and throughput savings compared to conventional one-at-a-time disk processing. The use of a thicker carrier during rough and/or fine polishing can permit a manufacture to use existing media polishing machinery and materials to effect two-disk-at-a-time polishing.

These and other advantages will be apparent from the disclosure of the invention(s) contained herein.

The above-described embodiments and configurations are neither complete nor exhaustive. As will be appreciated, other embodiments of the invention are possible utilizing, alone or in combination, one or more of the features set forth above or described in detail below.

BRIEF DESCRIPTION OF THE DRAWINGS

FIGS. 11A and 11B depict a plated and polished disk manufactured by a first experimental process;

FIGS. 12A and 12B depict a plated and polished disk manufactured by the first experimental process;

FIGS. 13A and 13B depict a plated and polished disk manufactured by the first experimental process;

FIGS. 14A and 14B depict a plated and polished disk manufactured by the first experimental process;

FIGS. 15A and 15B depict a plated and polished disk manufactured by the first experimental process;

FIGS. 16A and 16B depict a plated and polished disk manufactured by a second experimental process;

FIGS. 17A and 17B depict a plated and polished disk manufactured by the second experimental process;

FIGS. 18A and 18B depict a plated and polished disk manufactured by the second experimental process;

FIGS. 19A and 19B depict a plated and polished disk manufactured by the second experimental process;

FIGS. 20A and 20B depict a plated and polished disk manufactured by the second experimental process;

FIGS. 21A and 21B depict a sputtered disk of a Type A configuration;

FIGS. 22A and 22B depict a sputtered disk of the Type A configuration;

FIGS. 23A and 23B depict a sputtered disk of the Type A configuration;

FIGS. 24A and 24B depict a sputtered disk of the Type A configuration;

FIGS. 25A and 25B depict a sputtered disk of the Type A configuration;

FIGS. 26A and 26B depict a sputtered disk of the Type A configuration;

FIGS. 27A and 27B depict a sputtered disk of a Type B configuration;

FIGS. 28A and 28B depict a sputtered disk of the Type B configuration;

FIGS. 29A and 29B depict a sputtered disk of the Type B configuration;

FIGS. 30A and 30B depict a sputtered disk of the Type B configuration;

FIGS. 31A and 31B depict a sputtered disk of the Type B configuration; and

FIGS. 32A and 32B depict a sputtered disk of the Type B configuration.

DETAILED DESCRIPTION

Figure 2:
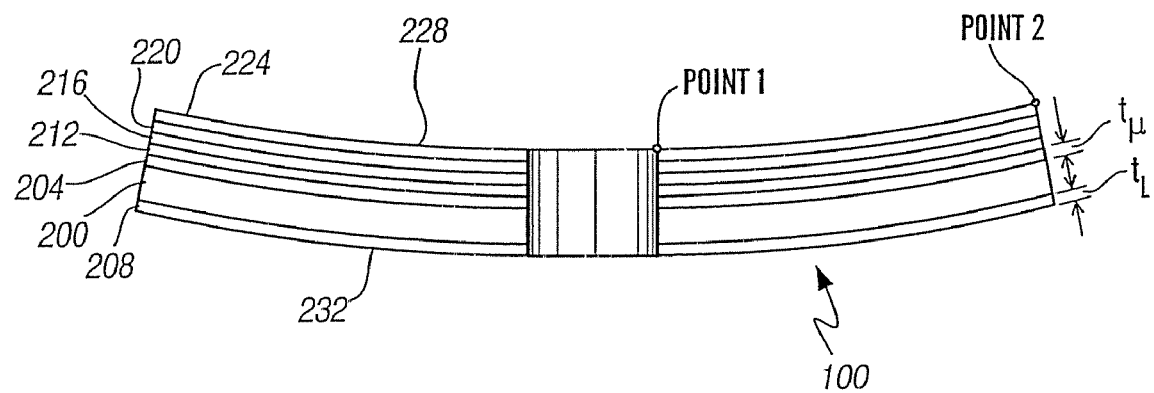
FIG. 2 is a cross-sectional view along disk center line 2-2 of FIG. 1.
Figure 1:
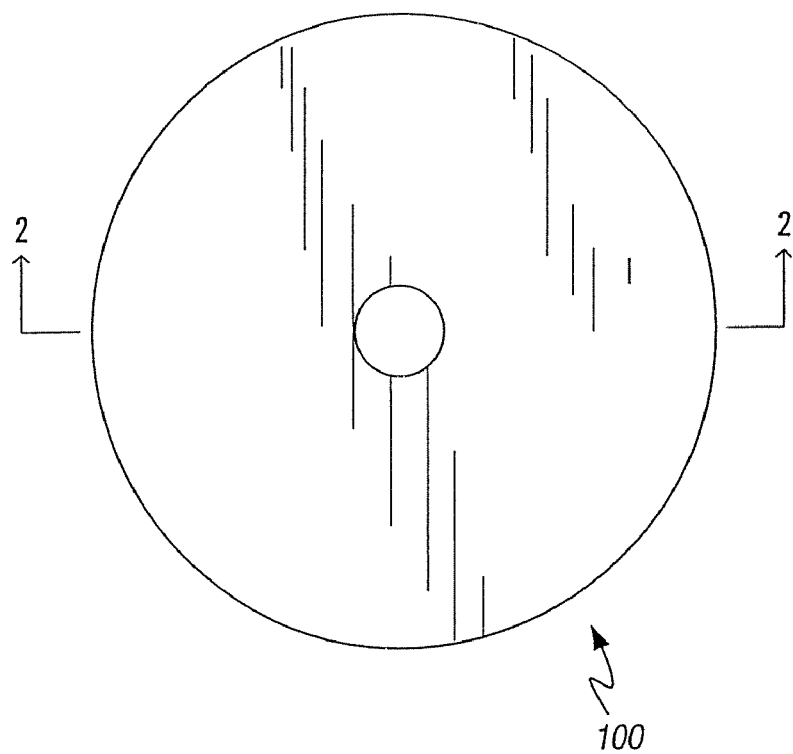
FIG. 1 is a plan view of a disk.
Figure 3:
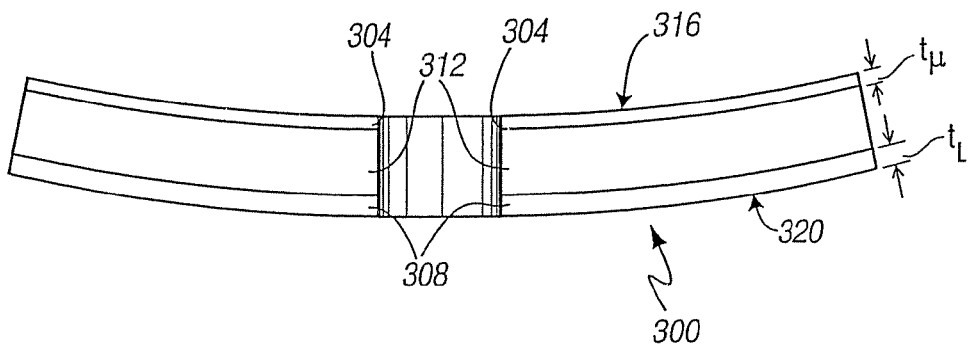
FIG. 3 is a cross-sectional view taken along the disk center line of a plated disk according to an embodiment of the present invention.

Referring to FIG. 3, a first embodiment of a disk according to the present invention will be described. Although the invention is described with specific reference to a magnetic recording disk, it is to be understood that the principles of the present invention may be extended to other recording media types, such as optical recording media, and magneto-optical recording media, and can be used for floppy or hard disks.

FIG. 3 depicts a plated disk (or intermediate (disk) structure) 300 having upper and lower selected layers 304 and 308, respectively, on a substrate disk 312. The substrate disk can be any suitable substrate disk, such as aluminum, aluminum alloys (e.g., AlMg), glass, ceramic materials, titanium, titanium alloys and graphite. The interface layers can be any suitable material for achieving acceptable magnetic recording properties in the overlying magnetic layer(s), such as iron oxide, nickel phosphorus, nickel molybdenum phosphorus, and nickel antimony phosphorus, with the latter three materials being preferred. The selected layers 304 and 308 are typically the same chemical composition and have different compositions from the substrate disk to provide an uneven internal stress distribution across the disk cross-section.

As can be seen from FIG. 3, the thicknesses of the upper and lower selected layers 304 and 308, which are $t_U$ and $t_L$, respectively, are different. When the selected layers are deposited so as to be in compression or have internal compressive stress, the thickness $t_U$ of the upper selected layer 304 which is to become the surface for sputtering of the underlayer, magnetic layer, and overcoat layer, is preferably less than the thickness $t_L$ of the lower selected layer 308. This causes the disk 300 to be curved (e.g., have a spherical curvature) in cross-section or have a bowl-shape, with the concave side of the disk 300 being the surface on which the additional layers are to be sputtered. This is so because the compressive stress in the thicker lower selected layer 308 exceeds the compressive stress in the thinner upper selected layer 304, thereby causing the disk to be warped towards the thinner selected layer.

The governing equations for this behavior are set forth below.

The stress $\epsilon$ in a selected layer is determined by the unique physical properties of a material and the technique and conditions of deposition:

The spherical curvature or radius of curvature R of the disk is provided by the following equation.

$$R = t_{sub}^2 / (6 \times \Delta t_{layer} \times \epsilon)$$

where $t_{sub}$ is the thickness of the substrate disk 312, $\Delta t_{layer}$ is the difference in thicknesses between the upper and lower selected layers 304 and 308, and $\epsilon$ is the stress in each of the layers.

While the relative thicknesses of the two layers depends on the magnitude of the internal compressive stress in each layer and the compressive stresses in the sputtered layers, the thickness of the upper selected layer 304 is typically no more than about 99.3%, more typically from about 98.3 to about 99.3% and even more typically from about 97.7 to about 98.3% of the thickness of the lower selected layer 308. In absolute terms, the thickness of the upper selected layer 304 ranges from about 7.5 to about 14.5 microns and that of the lower selected layer 308 from about 8 to about 15 microns. In other words, the difference in thickness between the upper and lower selected layers is typically at least about 0.075 microns and more typically ranges from about 0.2 to about 2 microns.

The flatness (or first flatness) of the disk 300 is relatively high and the flatness distribution, $3\sigma$, is relatively low. The flatness of each of the upper and lower surfaces 316 and 320, respectively, of the disk 300 typically is at least about 5 microns and more typically ranges from about 2 to about 10 microns.

Figure 4:
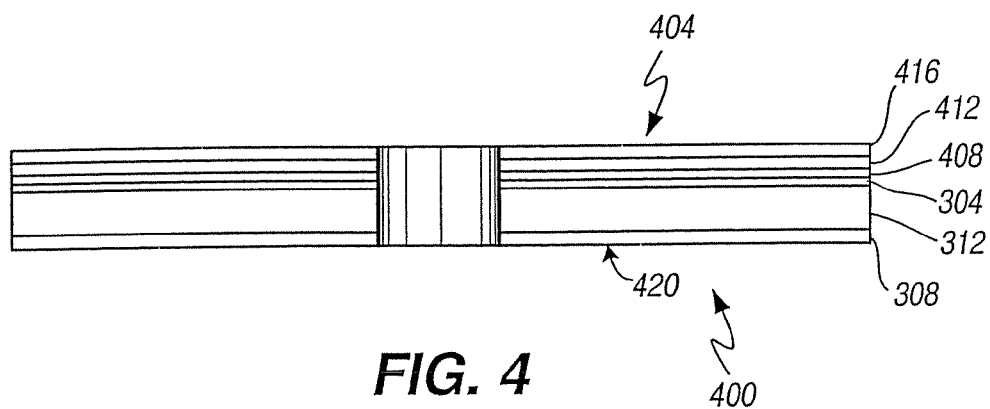
FIG. 4 is a cross-sectional view taken along the disk center line of a sputtered disk based on the plated disk of FIG. 3.

FIG. 4 depicts the same disk 400 after deposition of the overlying layers. Specifically, the upper surface 404 of the disk 400 has the underlayer 408, the magnetic layer 412, and the overcoat layer 416 deposited, preferably by sputtering. The underlayer 408 can be any material capable of providing the desired crystallography in the magnetic layer 412. Preferably, the underlayer 408 is chromium or a chromium alloy and has a thickness ranging from about 5 to about 20 nm. The magnetic layer 412 can be any ferromagnetic material, with the cobalt-platinum-based quaternary alloy having the formula CoPtXY or the five element alloy CoPtXYZ, wherein XY and Z can be tantalum, chromium, boron, or nickel. The thickness of the magnetic layer typically ranges from about 7 to about 20 nm. The overcoat layer 416 can be any suitable overcoat material, with carbon being preferred, and the thickness of the layer typically ranges from about 1 to about 6 nm.

The layers are typically in compression or have internal compressive stresses. The stress in each layer can be calculated using the equation above. The cumulative magnitude of the compressive stresses in the upper selected layer 304, the underlayer 408, the magnetic layer 412, and the overcoat layer 416 counteract the compressive stress in the lower selected layer 308 to cause the disk to flatten out or become more planar. For a given thickness of the lower selected layer 308, the resulting radius of curvature of the disk is inversely proportional to the cumulative thicknesses of the layers 304, 408, 412, and 416. Typically, the flatness of the disk 400 (or second flatness) is no more than about 17 microns and more typically is no more than about 12 microns.

The relative magnitudes of the cumulative compressive stress in the upper layers 304, 408, 412, and 416 versus that in the lower selected layer 308 may be controlled to provide a desired degree of flatness in the final disk. For example, when the cumulative compressive stress in the upper layers exceeds that in the lower selected layer, the upper surface 404 of the disk will be convex with the opening of the bowl-shape facing downward. When the cumulative compressive stress in the upper layers is less than that in the lower selected layer, the upper surface 404 of the disk will be concave with the opening of the bowl-shape facing upward. When the cumulative compressive stress in the upper layers is approximately equal to that in the lower selected layer, the upper surface 404 of the disk will be substantially or completely flat or planar as shown in FIG. 4. By these techniques, disks of varying radii of curvature and flatnesses can be produced. Typically, the flatness values can be made to range from about 1 to about 50 microns.

The control of the radius of curvature or flatness of the disk can be important. Not only is it important for the disk to comply with pertinent flatness specifications but also as the disk temperature fluctuates during read/write operations due to disk rotation the disk curvature changes. For example, the disk may become more concave or convex depending on the rate of change of the compressive stress of each layer due to thermal fluctuations. In one configuration, it is desirable for the disk to be more convex at higher operating temperatures and more concave at lower operating temperatures.

Figure 8:
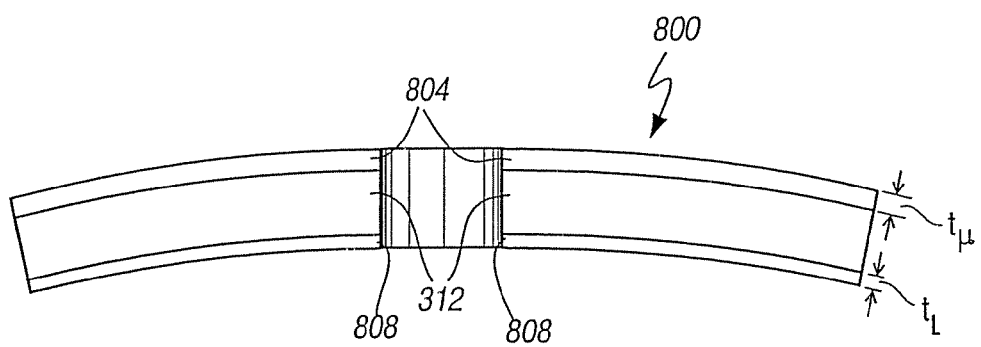
FIG. 8 is a cross-sectional view taken along the disk center line of a plated disk according to an embodiment of the present invention.

As seen in FIG. 8, for example, the thickness of the upper selected layer 804 can be selected to be thicker than that of the lower selected layer 808 to provide a convex upper disk surface 800. This surface will become even more convex when the underlayer, magnetic layer, and overcoat layer are deposited on the upper disk surface. In one configuration, the underlayer, magnetic layer, and overcoat layer are deposited so as to have a net internal tensile stress. This can be effected by selecting suitable materials for each layer and/or by using a suitable deposition technique other than sputtering. In that configuration, the use of an upper selected layer having a greater thickness than that of the lower selected layer may be used to counteract the tensile stress to provide the desired degree of disk surface flatness.

Figure 9:
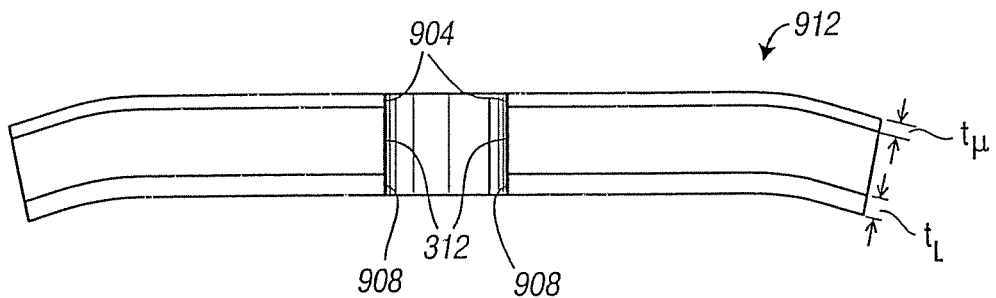
FIG. 9 is a cross-sectional view taken along the disk center line of a plated disk according an embodiment of the present invention.
Figure 10:
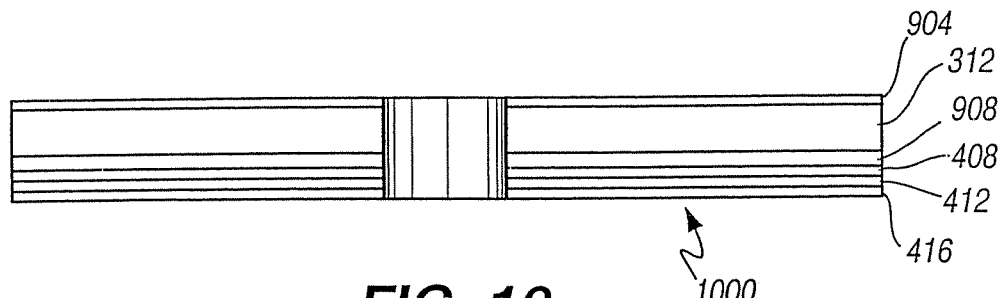
FIG. 10 is a cross-sectional view taken along the disk center line of a sputtered disk based on the disk of FIG. 9.

When nickel phosphorus is the selected layer on both sides of the disk, it is possible to deposit the layers with a desired degree of internal compressive or tensile stress by varying the composition of the electroless plating bath. When the layers are in tensile as opposed to compressive stress, the use of an upper selected layer 904 that is thinner than the lower selected layer 908 will, as shown in FIG. 9, cause the upper disk surface 912 to be convex. To offset this effect, the underlayer, magnetic layer, and overcoat layer, which are in compressive stress, are preferably deposited on the side having the thicker selected layer, which in the configuration of FIG. 9 is the lower selected layer 908. The tensile force exerted by the sputtered layers and the compressive force exerted by the upper selected layer offsets the tensile force exerted by the lower selected layer to provide a relatively planar disk 1000 as shown in FIG. 10.

An embodiment of the process to produce the disk of FIGS. 3 and 4 will now be discussed with reference to FIGS. 5 and 6.

Figure 5:
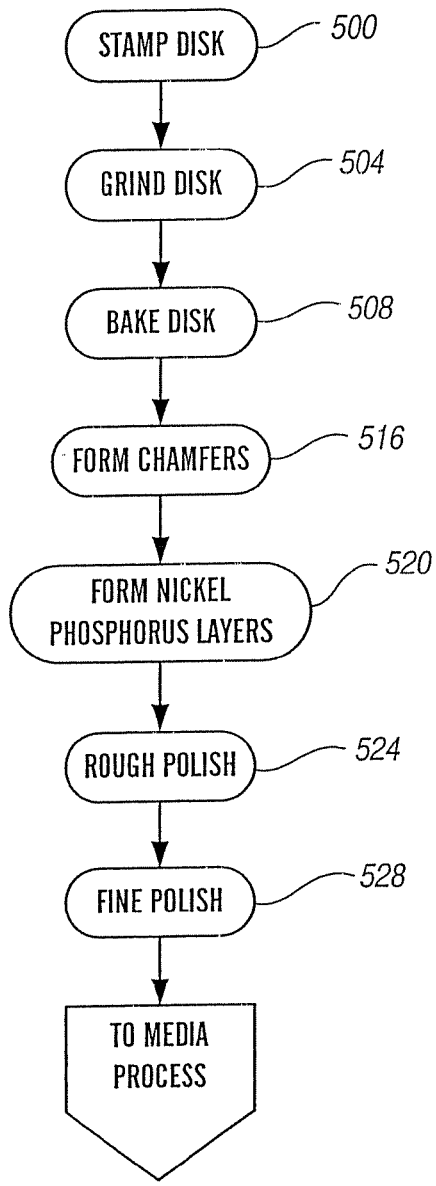
FIG. 5 is a flow chart of a substrate disk process according to an embodiment of the present invention according to an embodiment of the present invention.

Referring to FIG. 5, the substrate disk process will first be discussed. In step 500, the disk substrate disk 312 is stamped out of a sheet of material. The stamped disk in step 504 is ground to provide flat or planar upper and lower substrate disk surfaces. In step 508, the disk is baked, and in step 516 chamfers are formed on the upper and lower substrate disk surfaces. In step 520, the upper and lower selected layers, which are nickel phosphorus, are formed on the upper and lower substrate disk surfaces by electroless plating techniques. In this step, the thicknesses of the upper and lower selected layers are the same or substantially the same. Typically, the thickness of the upper selected layer is at least about 95% of the thickness of the lower selected layer and vice versa. Steps 500 through 520 are performed using techniques known to those of skill in the art.

Figure 6A:
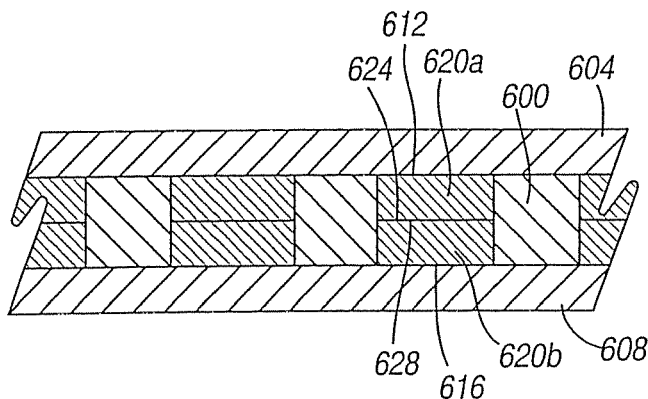
FIGS. 6A and B are cross-sectional views taken along a center line of a disk polishing assembly.

In steps 524 and 528, the selected layers are rough (step 524) and fine (step 528) polished to provide the plated disk configuration of FIG. 3. As shown in FIG. 6A, in each of steps 524 and 528 a disk holder 600 contains compartments (or holes) for receiving two disks simultaneously (referred to as "two-at-a-time disk polishing"). Upper and lower polishing pads 604 and 608 polish the outwardly facing surfaces 612 and 616 of the adjacent stacked disks 620*a, b*. The contacting disk surfaces 624 and 628 are not polished. The polished surfaces 612 and 616 are the upper disk surface 316 in FIG. 3. In this manner, two adjacent or stacked disks are polished simultaneously to provide a significant cost savings relative to the costs to produce dual-sided disks.

Preferably, the reduction in thickness of the upper selected layer is at least about 0.70% and more preferably ranges from about 1.0 to about 4.0%.

Figure 6B:
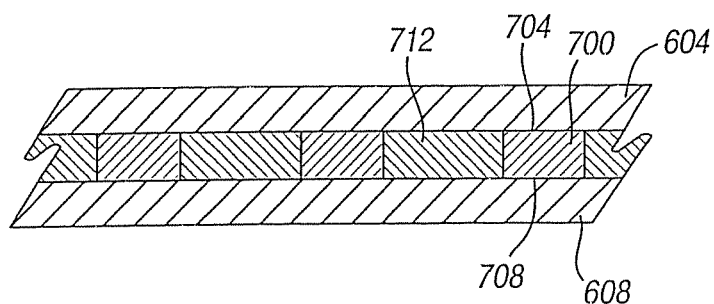

There are several ways to effect the reduction in layer thickness reduction in the polishing steps. In one approach, all of the thickness difference between the upper and lower selected layers is effected in the rough polishing step 524. In a second approach, all of the thickness difference between the upper and lower selected layers is effected in the fine polishing step 528. These two approaches require both sides of the disk to be polished in one of the polishing steps, which can be costly. The polishing in this step is performed using one-disk-at-a-time polishing as shown in FIG. 6B. Referring to FIG. 6B, upper and lower polishing pads 604 and 608 engage simultaneously the upper and lower sides 704 and 708 of each disk 700. The carrier 712 transports the disks through the polishing operation. In a third approach, a portion of the thickness difference between the upper and lower selected layers is effected in each of the rough and fine polishing steps. In this approach, the disks remain in the carrier 600 (FIG. 6A) through each of the polishing steps, which can represent a significant cost savings relative to the other two approaches.

In one process configuration, the thickness of the upper and lower selected layers 304 and 308 is the same after step 520 and range from about 8 to about 15 microns. In the rough polishing step 524, from about 70 to about 95% of the desired thickness reduction in the upper selected layer 304 is realized. The remaining desired thickness reduction in the upper selected layer 304 is realized in the fine polishing step 528.

After the fine polishing step 528, the plated disk is sent to the media process.

Figure 7:
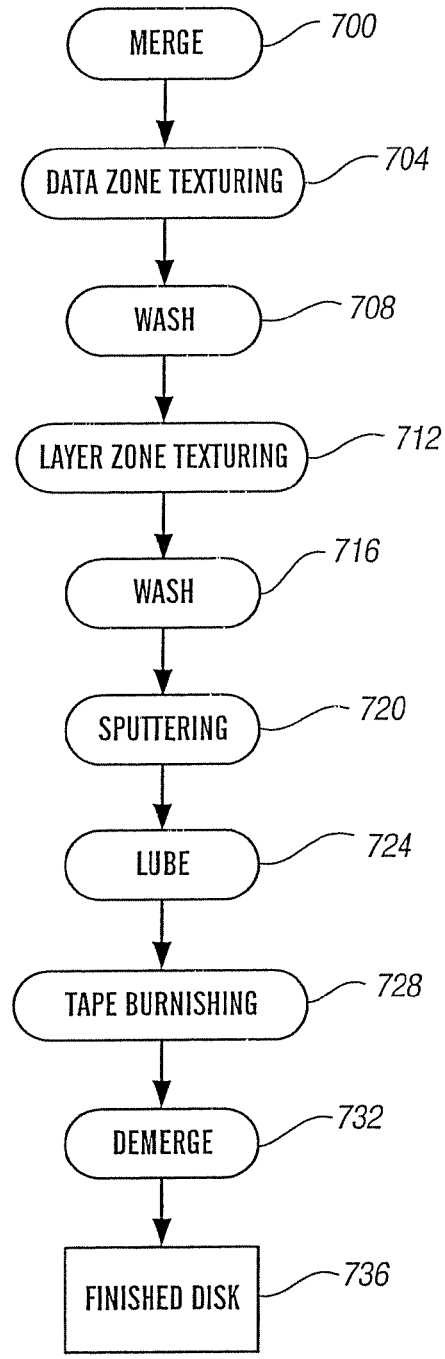
FIG. 7 is a flow chart of a media process according to an embodiment of the present invention.

The media process will be discussed with reference to FIG. 7.

In step 700, the plated disks are merged for processing. "Merging" refers to placing the disks back-to-back such that the upper disk surfaces 316 face outwardly. In other words, the lower disk surfaces 320 are adjacent to one another. The disks can be contact merged (as shown in FIG. 6A) in which case the lower disk surfaces 320 of each disk 300 physically contact one another or gap merged in which case the lower disk surfaces 320 of each disk 300 are separated by a gap.

In step 704, the upper disk surfaces 316 are data zone textured by known techniques.

In step 708, the upper disk surfaces 316 are washed to remove any debris or contaminants from the data zone texturing step.

In step 712, the upper disk surfaces 316 are layer zone textured by known techniques followed by washing of the upper disk surfaces in step 716.

In step 720, the underlayer 408, magnetic layer 412, and overcoat layer 416 are sputtered onto the upper disk surface by known techniques to produce the disk configuration of FIG. 4. As noted previously, the sputtered layers cause the disk curvature to flatten out. Other techniques can be used to deposit these layers, such as evaporation techniques, ion beam techniques, plating techniques, and the like.

The disk is then subjected to the application of a lubrication layer (such as an organic polymer, e.g., a perfluoropolyether) in step 724 and tape burnishing in step 728. Steps 724 and 728 are performed by techniques known to one of skill in the art.

In step 732, the adjacent disks are separated or demerged to provide the finished disk 736. The lower side 420 of the disk is the "inactive" or non-information storing side while the upper side 404 of the disk is the "active" or information storing side.

EXPERIMENTAL

A number of experiments were performed to illustrate the principles of the present invention. In a first series of experiments, various magnetic disks were made using both one-at-a-time and two-at-a-time disk polishing to evaluate the varying degrees of flatness of the disks and the use of such polishing techniques in the fine and rough polishing steps.

Type 1 disks were formed by electroless plating of nickel phosphorous (NiP) on both sides of aluminum magnesium (AlMg) disks. The NiP layers on both sides of the disks were equal and about 500µ. The concavity of the disks was approximately 5µ. The disk thickness was about 50 mil with a 95 mm outer diameter (OD) and 25 mm inner diameter (ID). The Type 1 disks were rough-polished using one-at-a-time polishing (as shown in FIG. 6B) maintaining equal removal of nickel material or both sides. The rough-polished substrate disks were then washed thoroughly and ensured to be virtually free of particulates. Washing of the disks minimizes formation of deep scratches during the final step polishing on the non-information-storing side (or inactive side). Such scratches usually penetrate on the information-storing side (or active side). The washed substrate disks are kept fully immersed in distilled water until ready for the final polishing step.

The final polishing step is performed by loading 2-disks at a time in the carrier hole, as shown in FIG. 6A. The carrier 600 is designed to accommodate the thickness of the two disks. The removal of the nickel material takes place only on one side of each disk during this final polishing step. By adjusting polishing time, the NiP thickness delta between the active and inactive sides and the resulting degree of concavity of the substrate disk can both be controlled.

The process variables in the rough and fine polishing steps are as follows:

Machine/Process Set-up Conditions:
Pressure: 180~220 dAN
Rotation: 14~20 rpm
Slurry for the Rough Polish: Aluminia (~0.45µ" size)
Slurry for Final Polish: Colloidal silica (35~100 nm size)
Machine type used: Peter Wolters AC319™ Disk Polishing Machine The intended thickness differential in the NiP layers on the active and inactive sides was about 10 to about 20µ", with the active side having the thinner NiP layer. The carrier had six carrier holes, each accommodating a single disk, in the rough polishing step and six holes, each accommodating two disks, in the fine polishing step. The thickness of the carrier was about 40 mil for the rough polishing step and about 90 mil for the fine polishing step. For each run, nine carriers were used.

Type 2 disks were formed by electroless plating of nickel phosphorous (NiP) on both sides of aluminum magnesium (AlMg) disks. The NiP layers on both sides of the disks were equal and about 500µ. The concavity of the disks were approximately 35µ. The disk thickness was about 50 mil with a 95 mm outer diameter (OD) and 25 mm inner diameter (ID).

The plated substrate disks were rough-polished by two-disk-at-a-time polishing techniques, such that two disks at a time were loaded in the same or a common carrier hole. The rough polishing step was thus different than the rough polishing step for Type 1 disks, in which one-disk-at-a-time polishing techniques were employed. The removal of the nickel material occurred on only one side of each disk during the rough polishing step. The washing and fine polishing steps were the same as the steps used for the Type 1 disks.

The process variables were the same as those shown above for Type 1 disk fabrication except for the thickness differential between the NiP layers on the active and inactive sides of the disks and the carrier thickness in the rough polishing step. The thickness of the carrier for both the rough and fine polishing steps was the same at about 90 mil.

The intended NiP thickness differential for the active and inactive sides of the disks was about 70 to about 90µ", with the NiP layer on the active side being thinner than the NiP layer on the inactive side.

The shape and flatness of resulting disks are shown in FIGS. 11A through 15B (Type 1 disks) and FIGS. 16A through 20B (Type 2 disks). It is important to note that the Type 2 disk flatness plots appear to be truncated in some areas because the measurement tool limits were locally exceeded. The Root Mean Square or RMS, Peak-to-Peak (P-V) and average flatness (Ra) values along with the scanned area are as follows for each figure:

in FIGS. 11A and 11B, the RMS is 1.270 microns, the P-V is 5.167 microns, the Ra is 1.093 microns, and the area scanned is the product of 93.77 and 92.76 square mm;

in FIGS. 12A and 12B, the RMS is 1.221 microns, the P-V is 4.773 microns, the Ra is 1.054 microns, and the scanned area is the product of 93.77 and 92.76 square mm;

in FIGS. 13A and 13B, the RMS is 0.666 mm, the P-V is 2.673 mm, the Ra is 0.575 mm, and the scanned area is the product of 93.77 and 92.76 square mm;

in FIGS. 14A and 14B, the RMS is 1.078 microns, the P-V is 4.417 microns, the Ra is 0.922 mm, and the scanned area 93.77 and 92.76 square mm;

in FIGS. 15A and 15B, the RMS is 1.378 microns, the P-V is 5.381 microns, the Ra is 1.191 microns, and the scanned area is the product of 93.77 and 92.76 square mm;

in FIGS. 16A and 16B, the RMS is 361.58 microns, the P-V is 1485.83 microns, the Ra is 318.23 microns, and the scanned area is the product of 91 and 86.33 square mm;

in FIGS. 17A and 17B, the RMS is 315.92 microns, the P-V is 1193.22 microns, the Ra is 273.25 microns, and the scanned area is the product of 71.61 and 92.30 square mm;

in FIGS. 18A and 18B, the RMS is 363.17 microns, the P-V is 1524.48 microns, the Ra is 300.23 microns, and the scanned area is the product of 48.27 and 89.54 square min;

in FIGS. 19A and 19B, the RMS is 376.56 microns, the P-V is 1424.40 microns, the Ra is 324.26 microns, and the scanned area is the product of 63.70 and 86.79 square mm;

in FIGS. 20A and 20B, the RMS is 365.63 microns, the P-V is 1432.22 microns, the Ra is 315.11 microns, and the scanned area is the product of 64.89 and 94.14 square mm;

in FIGS. 21A and 21B, the RMS is 1.437 microns, the P-V is 5.645 microns, the Ra is 1.235 microns, and the scanned area is the product of 91.00 and 90.00 square mm;

in FIGS. 22A and 22B, the RMS is 0.728 microns, the P-V is 2.870 microns, the Ra is 0.626 microns, and the scanned area is the product of 92.58 and 92.76 square mm;

in FIGS. 23A and 23B, the RMS is 1.265 microns, the P-V is 4.808 microns, the Ra is 1.088 microns, and the scanned area is the product of 91.39 and 90.46 square mm;

in FIGS. 24A and 24B, the RMS is 1.203 microns, the P-V is 4.822 microns, the Ra is 1.031 microns, and the scanned area is the product of 91.79 and 90.92 square mm;

in FIGS. 25A and 25B, the RMS is 1.339 microns, the P-V is 5.317 microns, the Ra is 1.145 microns, and the scanned area is the product of 90.60 and 91.38 square mm;

in FIGS. 26A and 26B, the RMS is 1.107 microns, the P-V is 4.192 microns, the Ra is 0.956 microns, and the scanned area is the product of 91.39 and 91.38 square mm;

in FIGS. 27A and 27B, the RMS is 0.128 microns, the P-V is 0.617 microns, the Ra is 0.107 microns, and the scanned area is the product of 93.77 and 94.14 square mm;

in FIGS. 28A and 28B, the RMS is 0.442 microns, the P-V is 2.254 microns, the Ra is 0.354 microns, and the scanned area is the product of 93.77 and 94.14 square mm;

in FIGS. 29A and 29B, the RMS is 0.234 microns, the P-V is 0.982 microns, the Ra is 0.202 microns, and the scanned area is the product of 93.77 and 94.14 square mm; in FIGS. 30A and 30B, the RMS is 0.246 microns, the P-V is 1.358 microns, the Ra is 0.190 microns, and the scanned area is the product of 93.77 and 94.14 square mm;

in FIGS. 31A and 31B, the RMS is 0.592 microns, the P-V is 2.926 microns, the Ra is 0.475 microns, and the scanned area is the product of 93.77 and 94.14 square mm; and in FIGS. 32A and 32B, the RMS is 0.454 microns, the P-V is 2.234 microns, the Ra is 0.371 microns, and the scanned area is the product of 93.77 and 94.14 square mm;

The peak-to-valley flatness values and selected layer thicknesses are summarized in the table below.

|  |  | Shape | Flatness | NiP thickness on A-side | Measured NiP thickness on B-side | Measured NiP thickness (A − B) |
|---|---|---|---|---|---|---|
| Type 1 | substrate 1 | concave | 5.167μ" | 404μ" | 415μ" | −11μ" |
|  | substrate 2 | concave | 4.773μ | 368μ" | 375μ" | −7μ" |
|  | substrate 3 | concave | 2.673μ | 423μ" | 432μ" | −9μ" |
|  | substrate 4 | concave | 4.417μ | 402μ" | 416μ" | −14μ" |
|  | substrate 5 | concave | 5.381μ | 400μ" | 429μ" | −29μ" |
| Type 2 | substrate 1 | concave | 35.69μ | 388μ" | 476μ" | −88μ" |
|  | substrate 2 | concave | 30.31μ | 410μ" | 485μ" | −75μ" |
|  | substrate 3 | concave | 38.72μ | 388μ" | 480μ" | −92μ" |
|  | substrate 4 | concave | 36.18μ | nda | nda | nda |
|  | substrate 5 | concave | 36.38μ | nda | nda | nda |

(nda: no data available)

The average NiP thickness differential for Type 1 disk samples is about 14μ" while that for Type 2 disk samples about 85μ". Each value corresponds to the amount of NiP material removed (stock removal) during final polishing (Type 1 disks) and during rough and final polishing (Type 2 disks). Type 1 disks exhibited about 5μ concavity, with simultaneous two-disks-at-a-time polishing being implemented only in the final polishing step. Type 2 disks exhibited about 35μ concavity, with simultaneous two-disks-at-a-time polishing being implemented in both the rough and fine polishing steps.

The degree of concavity induced as a result of uneven material removal on the active/inactive sides appears to be proportional to the NiP layer thickness differential between the two sides. Typical counterpart substrate disks polished utilizing conventional methods (as depicted in FIG. 6B) exhibited average flatness values of about 2μ"–(~50% of the flatnesses being concave and ~50% of the flatnesses being convex) and the NiP layer thickness differential being less than about 3μ". Strictly speaking, the thickness differential is the average of the absolute values of NiP layer thickness differentials among the various disks. Further experiments were performed to determine the degree to which sputtered thin films can flatten pre-bent disks, such as the Type 1 and 2 disks above. Two different types of magnetic recording disks were fabricated. The two different types of disks had the following structures:

| Type A disks (control) | NiP layer thickness on right side: ~415 μ" NiP layer thickness on left side: ~415 μ" Sputtered thin films with total thickness of ~300 Å NiP layer thickness differential between the right and left sides: ~0 μ" |
|---|---|
| Type disks | BNiP layer thickness on right (active)-side: ~415 μ" NiP layer thickness on left (inactive)-side: ~435 μ" Sputtered thin films with total thickness of ~300 Å NiP layer thickness differential between right and left sides: ~20 μ" |

The shapes and flatnesses of resulting disks are shown in FIGS. 21A and 26B (Type A disks) and FIGS. 27A through 32B (Type B disks). The flatnesses of the disks are set forth below:

| Type A | disk 1 | (FIGS. 21A-B) | R-convex | 5.645 microns |
|---|---|---|---|---|
|  | disk 2 | (FIGS. 22A-B) | R-convex | 2.870 microns |
|  | disk 3 | (FIGS. 23A-B) | R-convex | 4.808 microns |
|  | disk 4 | (FIGS. 24A-B) | R-convex | 4.822 microns |
|  | disk 5 | (FIGS. 25A-B) | R-convex | 5.317 microns |
|  | disk 6 | (FIGS. 26A-B) | R-convex | 4.192 microns |

| Type B | disk 1 | (FIGS. 27A-B) | Irregular shape | 0.617 microns |
| --- | --- | --- | --- | --- |
| | disk 2 | (FIGS. 28A-B) | R-convex | 2.254 microns |
| | disk 3 | (FIGS. 29A-B) | R-concave | 0.982 microns |
| | disk 4 | (FIGS. 30A-B) | R-convex | 1.358 microns |
| | disk 5 | (FIGS. 31A-B) | R-concave | 2.926 microns |
| | disk 6 | (FIGS. 32A-B) | R-concave | 2.234 microns |

As can be seen from the above test results, Type-A disks exhibited all "cone"-shapes with higher flatness values whereas Type-B disks exhibited some "cone" shapes and some "bowl" shapes but with reduced flatness values. Type-B disks were flatter than Type-A disks because Type-B disks had a NiP layer thickness differential of around ~20μ" whereas Type-A disks had a NiP layer thickness differential of around 0μ". This NiP layer thickness differential can be tailored to achieve specific flatnesses for specific applications, as noted previously.

The experimental results provided above show that pre-bent disks can be utilized in the magnetic media industry when one-side sputtering causes disks to bend and form a convex shape due to compressive stress imbalance within the various layers/films. By depositing sputtered films onto the side of the substrate disk which is already bent to form a concave shape ("bowl"-shape, looking to the side in question), the two bending tendencies in opposite directions (from the thicker NiP layer on one side of the disk and the thinner NiP layer and sputtered films on the other side of the disk) are cancelled. The cancellation (or equalization) of the compressive stresses on both sides of the disks cause the resulting disks (after sputter) to be flatter.

A number of variations and modifications of the invention can be used. It would be possible to provide for some features of the invention without providing others.

For example in one alternative embodiment, the present invention applies to any form-factor disk, whether 95 mm, 84 mm, 65 mm, 48 mm, or 25 mm in diameter and 63 mil, 50 mil, 40 mil, 31.5 mil, or 25 mil in thickness.

In another alternative embodiment, the use of differential thicknesses of selected layers can be employed in dual-sided disks in which differing cumulative intra-layer stresses are present on both sides of the disk. This situation can occur, for example, when differing types or numbers of layers are located on both sides of the disk. By way of illustration, one side of the disk can have one magnetic layer and the other side two magnetic layers or one side of the disk can have a magnetic layer having a different chemical composition than a magnetic layer on the other side of the disk. The stress imbalance can cause warping of the disk as previously noted. Differential thicknesses of selected layers on the two sides of the disk can be used to reduce or eliminate the stress imbalance and therefore provide a more planar disk.

In yet another alternative embodiment, the thicknesses in the upper and lower selected layers 304 and 308 is effected during selected layer deposition rather than or in addition to that effected during rough and/or fine polishing. In other words, differing thicknesses of selected layers are applied to the different sides of the disk.

In yet another alternative embodiment, pre-bending or pre-shaping of the substrate disk and selected layers can be accomplished using mechanical techniques (which cause the plated disk to deform plastically), thermal techniques, and combinations thereof.

The present invention, in various embodiments, includes components, methods, processes, systems and/or apparatus substantially as depicted and described herein, including various embodiments, subcombinations, and subsets thereof. Those of skill in the art will understand how to make and use the present invention after understanding the present disclosure. The present invention, in various embodiments, includes providing devices and processes in the absence of items not depicted and/or described herein or in various embodiments hereof, including in the absence of such items as may have been used in previous devices or processes, e.g. for improving performance, achieving ease and or reducing cost of implementation.

The foregoing discussion of the invention has been presented for purposes of illustration and description. The foregoing is not intended to limit the invention to the form or forms disclosed herein. In the foregoing Detailed Description for example, various features of the invention are grouped together in one or more embodiments for the purpose of streamlining the disclosure. This method of disclosure is not to be interpreted as reflecting an intention that the claimed invention requires more features than are expressly recited in each claim. Rather, as the following claims reflect, inventive aspects lie in less than all features of a single foregoing disclosed embodiment. Thus, the following claims are hereby incorporated into this Detailed Description, with each claim standing on its own as a separate preferred embodiment of the invention.

Moreover though the description of the invention has included description of one or more embodiments and certain variations and modifications, other variations and modifications are within the scope of the invention, e.g. as may be within the skill and knowledge of those in the art, after understanding the present disclosure. It is intended to obtain rights which include alternative embodiments to the extent permitted, including alternate, interchangeable and/or equivalent structures, functions, ranges or steps to those claimed, whether or not such alternate, interchangeable and/or equivalent structures, functions, ranges or steps are disclosed herein, and without intending to publicly dedicate any patentable subject matter.

What is claimed is:

1. A method for producing an information-storage media disk having first and second interface layers, a first information storage layer on a first side of a substrate disk, and a second information storage layer on second side of the substrate disk, comprising:

depositing the first interface layer on the first side of a substrate disk and the second interface layer on the second side of said substrate disk, respectively, wherein the first and second interface layers have differing chemical compositions, and wherein the first and second interface layers cause the substrate disk to be curved;

controlling curvature of the disk by removing unequal thicknesses from the first and second interface layers, wherein, after the removal step, the first and second interface layers remain, the thickness of the first interface layer being less than the thickness of the second interface layer and the flatness of the first and second sides is from 2 to 10 microns;

subsequently depositing the first information storage layer on the first interface layer and the second information storage layer on the second interface layer; and controlling curvature of the information-storage media by forming the information-storage layers and the first and second interface layers to provide the information-storage media.

2. The media of claim 1, wherein the first and second interface layers comprise nickel phosphorus and wherein the other one of the first and second interface layers is not adjacent to the information-storage layer.

3. The media of claim 1, wherein a first thickness of the first interface layer is no more than about 99.3% of a second thickness of the second interface layer.

4. The media of claim 1, further comprising controlling curvature of the information-storage media by removing unequal thicknesses from the first and second interface layers wherein after the removal flatness of the first and second sides is from about 2 to about 10 microns, and wherein a first thickness of the first interface layer is no more than about 99.3% of a second thickness of the second interface layer.

5. The media of claim 1, wherein the information-storage layer is a ferromagnetic material, wherein the information-storage layer is adjacent to the first interface layer, and further comprising:
   an underlayer positioned between the information-storage layer and the first interface layer; and
   an overcoat layer, wherein the information-storage layer is positioned between the overcoat layer and the underlayer, wherein the information-storage layer and underlayer are each in compression.

6. The media of claim 1, wherein the first and second interface layers have the same chemical composition and wherein a compressive stress in the first interface layer is less than a compressive stress in the second interface layer.

7. The media of claim 1, wherein the information-storage layer is adjacent to the second interface layer and the second interface layer is located between the information-storage layer and the substrate, wherein the first side is free of an information-storage layer, and, wherein the information-storage layer is in tension.

8. The media of claim 1, wherein the first and second interface layers are each in tension and wherein the information-storage layer is in compression.

9. The media of claim 1, wherein depositing first and second interface layers on first and second sides comprises:
   depositing the first interface layer at a first thickness; and
   depositing the second interface layer at a second thickness, wherein the first and second thicknesses are different.

10. The media of claim 1, wherein depositing first and second interface layers on first and second sides comprises:
    depositing the first and second interface layers on the substrate disk, wherein, after the depositing step, the thicknesses of the first and second interface layers are substantially the same.

11. The media of claim 1, wherein the removing step comprises:
    rough polishing only one of the first and second sides of the first and second interface layers.

12. The media of claim 1, wherein the removing step comprises:
    fine polishing only one of the first and second sides of the first and second interface layers.

13. The media of claim 1, wherein the removing step comprises:
    rough polishing only one of the first and second sides of the first and second interface layers to remove a first thickness of the corresponding first and second interface layer; and
    fine polishing the only one of the first and second sides to remove a second thickness of the corresponding first and second interface layer.

* * * * *